(12) United States Patent
Izumi et al.

(10) Patent No.: US 7,617,833 B2
(45) Date of Patent: Nov. 17, 2009

(54) APPARATUS AND METHOD FOR PERFORMING PREDETERMINED PROCESSING ON SUBSTRATE WITH ULTRASONIC WAVES

(75) Inventors: Akira Izumi, Kyoto (JP); Kenichi Sano, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 729 days.

(21) Appl. No.: 11/296,808

(22) Filed: Nov. 29, 2005

(65) Prior Publication Data
US 2006/0130872 A1 Jun. 22, 2006

(30) Foreign Application Priority Data
Dec. 21, 2004 (JP) .............................. 2004-368887

(51) Int. Cl.
*B08B 3/12* (2006.01)
(52) U.S. Cl. ..................................... 134/128
(58) Field of Classification Search ................... 134/128
See application file for complete search history.

(56) References Cited

U.S. PATENT DOCUMENTS 5,927,306 A * 7/1999 Izumi et al. .................. 134/155
6,539,952 B2 * 4/2003 Itzkowitz ..................... 134/1.3

FOREIGN PATENT DOCUMENTS

| JP | 64-27679 | 1/1989 |
| JP | 8-130202 | 5/1996 |
| JP | 2000-508237 | 7/2000 |
| JP | 2002-86068 | 3/2002 |
| JP | 2004-515053 | 5/2004 |

OTHER PUBLICATIONS

Japanese Office Action issued Jul. 14, 2009 in connection with corresponding Japanese Patent Application No. 2004-368887 (JP8-130202 was previously submitted in an IDS filed Jan. 27, 2006 and is therefore not enclosed).

* cited by examiner

*Primary Examiner*—Frankie L Stinson
*Assistant Examiner*—Samuel A Waldbaum
(74) *Attorney, Agent, or Firm*—Ostrolenk Faber LLP

(57) ABSTRACT

A blocking plate 3 is disposed opposing a substrate W which is held by plural chuck pins 17 and a processing liquid is supplied from a processing liquid nozzle 5 to a space SP between the front surface Wf of the substrate and an opposed surface 3a of the blocking plate 3, whereby the processing liquid attains the liquid-tight state. While the liquid-tight state with the processing liquid is maintained, the substrate W and the blocking plate 3 rotate. In this condition, a liquid (pure water) to which ultrasonic vibration has propagated is injected from an ultrasonic nozzle 7 approximately perpendicular to a side wall surface 3b of the blocking plate 3. While the ultrasonic vibration spreads inside the blocking plate 3 along the horizontal direction, some vibrational waves spread uniformly and widely from the opposed surface 3a to the processing liquid attaining the liquid-tight state and vibrate the processing liquid. This prevents concentration of the vibrational energy at the front surface Wf, which makes it possible to uniformly process the substrate W while suppressing damage to the substrate W.

7 Claims, 5 Drawing Sheets

FIG. 4A : FORMING LIQUID-TIGHT STATE WITH PROCESSING LIQUID
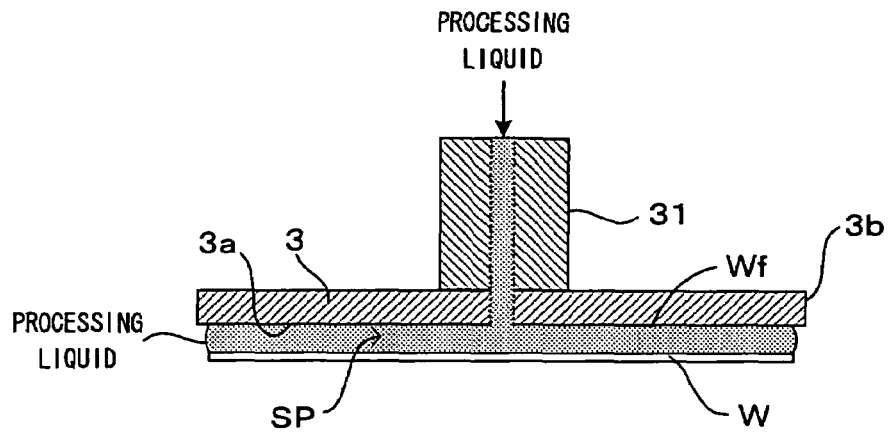
FIG. 4B : INJECTING ULTRASONIC PROPAGATION LIQUID FROM NOZZLE
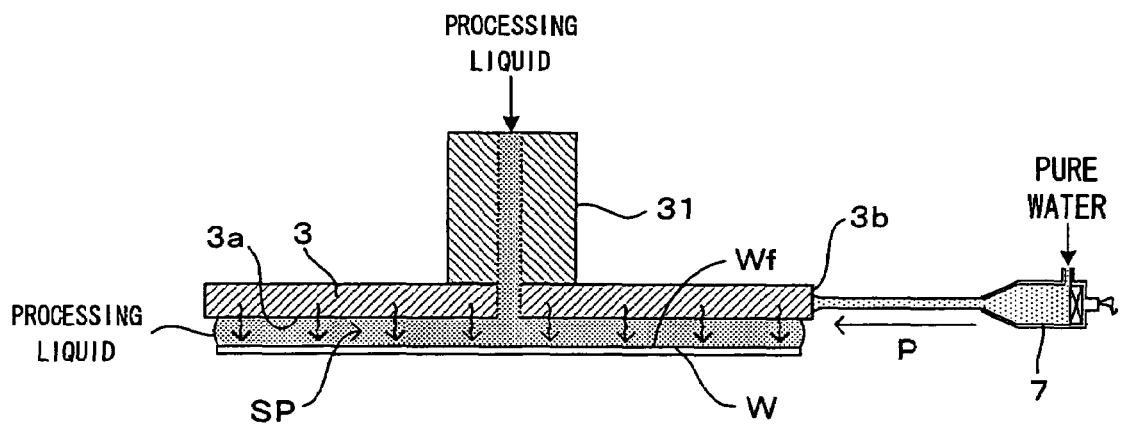
FIG. 4C : SPINNING OFF PROCESSING LIQUID
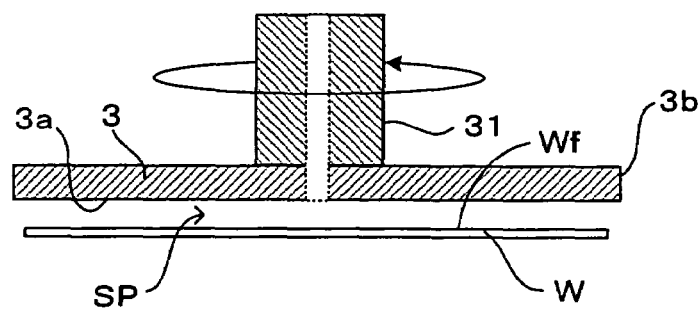

F I G. 5
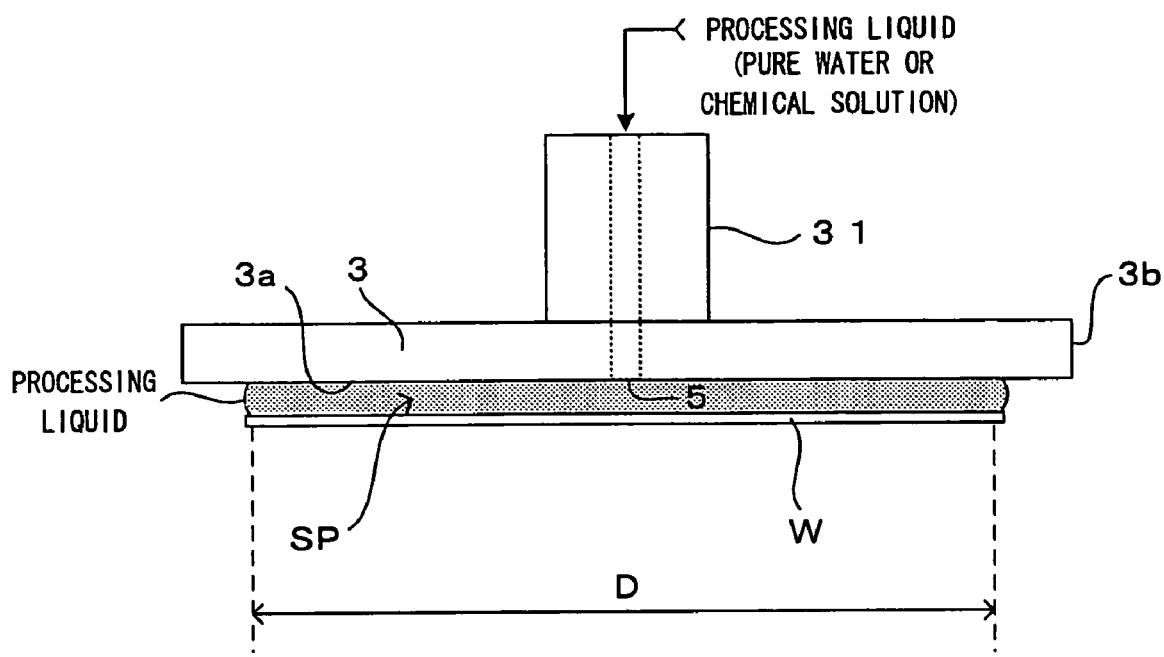

APPARATUS AND METHOD FOR PERFORMING PREDETERMINED PROCESSING ON SUBSTRATE WITH ULTRASONIC WAVES

CROSS REFERENCE TO RELATED APPLICATION

The disclosure of Japanese Patent Application No. 2004-368887 filed Dec. 21, 2004 including specification, drawings and claims is incorporated herein by reference in its entirety.

BACKGROUND OF THE INVENTION

1. Field of the Invention

The present invention relates to a substrate processing apparatus and a substrate processing method with which it is possible to perform, by means of propagating ultrasonic waves, predetermined processing, such as cleaning, on various types of substrates such as semiconductor wafers, glass substrates for photomasks, glass substrates for liquid crystal displays, glass substrates for plasma displays and optical disk substrates.

2. Description of the Relates Art

A conventional approach to remove extremely small contaminants such as particles adhering upon a substrate is to apply ultrasonic vibration upon a processing liquid and propagate the ultrasonic vibration to the substrate while supplying the processing liquid to the substrate. The application of physical vibration originating from the ultrasonic waves in addition to chemical cleaning owing to the processing liquid achieves better cleaning of the substrate and effective removal of particles. A method of cleaning the substrate in this fashion may be a batch-type cleaning method which requires immersion of many substrates at once into a processing liquid or a single wafer-type cleaning method which requires processing one substrate at a time while supplying a processing liquid to a surface of the substrate.

Published Japanese Translation of PCT International Application No. P2004-515053A for instance describes a certain apparatus as a single wafer-type substrate processing apparatus. In this apparatus, at least one ultrasonic transducer is buried in an opposed member (platter) in the proximity of the back surface (non-device seating surface) of a substrate so that ultrasonic vibration propagate to the substrate via a chemical agent which is in contact with both the substrate and the opposed member. Some ultrasonic waves entering the back surface of the substrate are transmitted through the substrate and reaches the front surface (device seating surface) of the substrate. With the chemical agent supplied to the front surface of the substrate from a nozzle which is disposed above the substrate, the chemical agent vibrates because of the ultrasonic waves propagating to the front surface of the substrate. In this manner, the chemical agent to which the ultrasonic vibration has added cleans the front surface of the substrate.

Meanwhile, in the apparatus described in Japanese Patent Application Unexamined Publication No. H8-130202, an ultrasonic transducer is built within a processing liquid guide which is disposed opposing the front surface of a substrate and supplies a processing liquid to the front surface of the substrate, thereby enhancing the cleaning effect with ultrasonic vibration propagating to the processing liquid.

SUMMARY OF THE INVENTION

By the way, as patterns created on a substrate during manufacturing of a device become increasingly finer and smaller, application of excessive physical impact upon a substrate for removal of particles which are on the substrate will easily destroy and damage the patterns. It is therefore necessary that while irradiating the substrate with ultrasonic waves whose energy is enough to remove particles off from the substrate, a threshold value set for the vibrational energy reaching the substrate is controlled such that the energy will be large only to the extent not damaging the patterns created on the substrate. It is also necessary to equally propagate the controlled vibrational energy to a surface-to-be-processed which needs be cleaned with the ultrasonic waves, so that the particle removal capability will be uniform within the surface-to-be-processed of the substrate.

A conventional apparatus has the following problems since an ultrasonic transducer is attached directly to an opposed member which is in the proximity of and opposed against a substrate to thereby propagate ultrasonic vibration to the substrate. That is, the size of the ultrasonic transducer itself is limited. Hence, for equal propagation of an ultrasonic vibrational energy controlled to a predetermined threshold value all over a surface-to-be-processed, plural transducers need be attached to the opposed member in such a manner that the transducers are uniformly spaced apart from the surface-to-be-processed of the substrate, and it is also necessary to evenly control an oscillation output from each transducer to a low output so that an energy large enough but not damaging patterns will be obtained. Despite this, the transducers have different characteristics each other and it is extremely difficult to evenly attach the transducers to the opposed member, which results in concentration of the vibrational energy instead of equal propagation of the vibrational energy all over the surface-to-be-processed. This may result in damaging a pattern formed on the substrate, thereby failing to uniformly process the substrate. Further, it is virtually impossible to control oscillation outputs from the individual transducers to low outputs while preventing the oscillation outputs from varying.

The present invention has been made in light of the problems above. Accordingly, the object of the present invention is to provide a substrate processing apparatus and method with which it is possible to uniformly process a substrate while suppressing damage upon the substrate.

According to a first aspect of the present invention, there is provided a substrate processing apparatus, comprising: a substrate holder which holds a substrate approximately horizontally; a vibration member made of a material which permits propagation of ultrasonic vibration, said vibration member comprising an opposed surface which can become opposed against a surface-to-be-processed of said substrate which is held by said substrate holder, said opposed surface being spaced apart from but opposed against said surface-to-be-processed; a processing liquid supplier which supplies a processing liquid to a space which is formed between said surface-to-be-processed of said substrate and said opposed surface of said vibration member, thereby filling said space up with said processing liquid in liquid-tight state; and an ultrasonic wave applying element which applies a liquid to which ultrasonic vibration has propagated to a non-opposed surface of said vibration member except said opposed surface.

According to a second aspect of the present invention, there is provided a substrate processing method, comprising steps of: a vibration member positioning step of positioning one surface of a vibration member, which is made of a material which permits propagation of ultrasonic vibration, as an opposed surface against a surface-to-be-processed of a substrate; a liquid-tight state forming step of supplying a processing liquid to a space which is formed between said surface-to-be-processed of said substrate and said opposed surface of said vibration member and accordingly forming the liquid-tight state with said processing liquid; and an ultrasonic wave applying step of applying a liquid to which ultrasonic vibration has propagated to a non-opposed surface of said vibration member except said opposed surface.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 4A through 4C are schematic drawings which show the operations which the substrate processing apparatus of FIG. 1 performs; and FIG. 5 is a drawing which illustrates a modified embodiment of a blocking plate.

DETAILED DESCRIPTION OF THE PREFERRED EMBODIMENT

Figure 1:
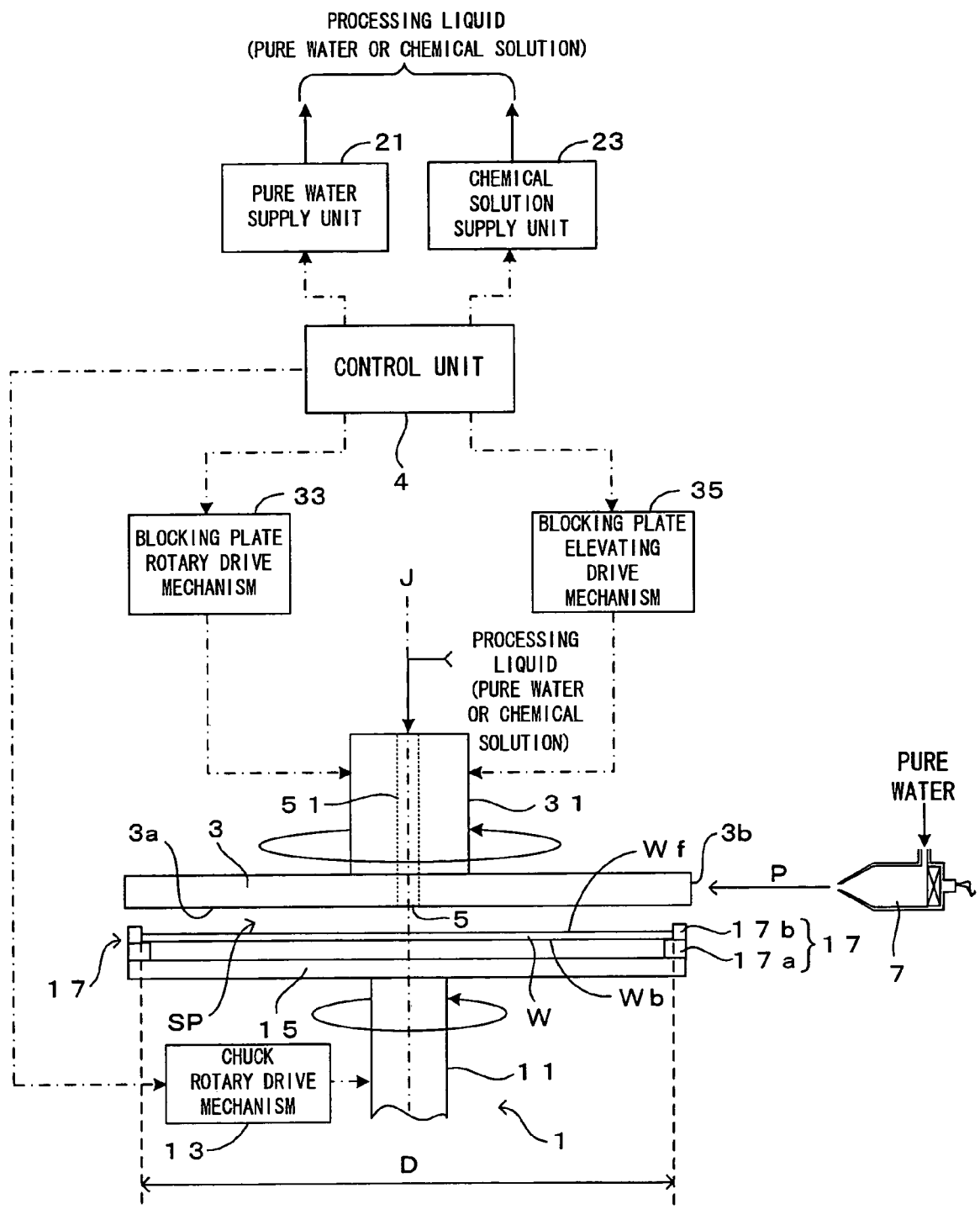
FIG. 1 is a drawing which illustrates an embodiment of the substrate processing apparatus according to the invention.

FIG. 1 is a drawing which illustrates an embodiment of the substrate processing apparatus according to the invention. This substrate processing apparatus is a single wafer-type substrate processing apparatus which is used for cleaning to remove contaminants, such as particles and various types of metallic impurities, adhering to the front surface Wf (which corresponds to the "surface-to-be-processed" of the invention) of a substrate W which may be a semiconductor wafer or the like. To be more specific, this apparatus is an apparatus which supplies pure water or a chemical solution for cleaning (hereinafter referred to as the "processing liquid") to the front surface Wf bearing device patterns and applies ultrasonic vibration to the processing liquid to thereby clean the substrate W.

This substrate processing apparatus comprises a spin chuck 1 which rotates the substrate W while holding the substrate W horizontally in such a condition that the front surface Wf of the substrate W is directed toward above, a blocking plate 3 which is disposed opposing the top surface of the substrate W which is held by the spin chuck 1, a processing liquid nozzle 5 which supplies the processing liquid toward a central section of the top surface of the substrate W which is held by the spin chuck 1, and an ultrasonic nozzle 7 which injects out a liquid to which ultrasonic vibration has propagated (hereinafter referred to as the "ultrasonic propagation liquid") toward the blocking plate 3.

A rotation shaft 11 of the spin chuck 1 is linked to a rotation shaft of a chuck rotary drive mechanism 13 which contains a motor and as such, is capable of rotating about a rotation axis J which extends vertically when driven by the chuck rotary drive mechanism 13. A disk-shaped spin base 15 is linked to and integrated with the top end of the rotation shaft 11 by a fastening part such as a screw. Hence, when the chuck rotary drive mechanism 13 drives in response to an operation command received from a control unit 4 which controls the apparatus as a whole, the spin base 15 rotates about the rotation axis J. In this embodiment, the chuck rotary drive mechanism 13 thus functions as the "substrate rotator" of the invention.

In the vicinity of a rim portion of the spin base 15, there are plural chuck pins 17 which are disposed upright to hold the substrate W at a rim portion of the substrate W. There may be three or more chuck pins 17 for secure holding of the circular substrate W, and the chuck pins 17 are disposed at equal angles in the rim portion of the spin base 15. Each chuck pin 17 comprises a substrate support part 17a which supports the rim portion of the substrate W from below and a substrate hold part 17b which presses an outer edge surface of the substrate W supported by the substrate support part 17a and holds the substrate W. Each chuck pin 17 is capable of switching between a pressing state in which its substrate hold part 17b presses the outer edge surface of the substrate W and a release state in which its substrate hold part 17b leaves the outer edge surface of the substrate W.

The plural chuck pins 17 are in the release state when handing the substrate W over to the spin base 15 but in the pressing state during cleaning of the substrate W. When in the pressing state, the chuck pins 17 are capable of grabbing the substrate W at the rim portion of the substrate W and holding the substrate W approximately horizontally at a predetermined distance from the spin base 15. The substrate W is thus held with its front surface (device pattern seating surface) Wf directed toward the top surface and its back surface Wb directed toward the bottom surface. In this embodiment, the chuck pins 17 thus function as the "substrate holder" of the invention.

The disk-shaped blocking plate 3 (which corresponds to the "vibration member" of the invention) opposed against the substrate W held at the chuck pins 17 is disposed horizontally above the spin chuck 1. The plan size of the blocking plate 3 is slightly larger than the plan size D of the substrate W (the front surface Wf) so that the blocking plate 3 can cover the entire area of the front surface Wf of the substrate W. The blocking plate 3 is attached to the bottom end of a rotation shaft 31 disposed coaxially with the rotation shaft 11 of the spin chuck 1 such that the blocking plate 3 can rotate with the rotation shaft 31 as one unit. A blocking plate rotary drive mechanism 33 is linked to the rotation shaft 31, and when a motor of the blocking plate rotary drive mechanism 33 drives in response to an operation command received from the control unit 4, the blocking plate 3 rotates about the rotation axis J. Controlling such that the blocking plate rotary drive mechanism 33 and the chuck rotary drive mechanism 13 are in synchronization to each other, the control unit 4 makes the blocking plate 3 rotate in the same rotation direction and at the same rotation speed as the spin chuck 1. In this embodiment, the blocking plate rotary drive mechanism 33 thus functions as the "vibration member rotator" of the invention.

Further, the blocking plate 3 is connected with a blocking plate elevating drive mechanism 35. As an actuator for moving up and down (e.g., an air cylinder) of the blocking plate elevating drive mechanism 35 operates, the blocking plate 3 comes close to and opposed against the spin base 15 and moves away from the spin base 15. To be more specific, making the blocking plate elevating drive mechanism 35 drive, the control unit 4 moves up the blocking plate 3 to a retract position which is above the spin chuck 1 for loading and unloading of the substrate W to the substrate processing apparatus. Meanwhile, for cleaning of the substrate W, the control unit 4 moves down the blocking plate 3 to a predetermined processing position which is set close to the front surface Wf of the substrate W which is held by the spin chuck 1. As a result, the bottom surface (opposed surface 3a) of the blocking plate 3 is positioned close but at a distance to and facing the front surface Wf of the substrate.

The rotation shaft 31 is a hollow shaft in which a processing liquid supply pipe 51 is inserted. The tip end of the processing liquid supply pipe 51 is the processing liquid nozzle 5. The processing liquid supply pipe 51 is connected with a pure water supply unit 21 and a chemical solution supply unit 23, whereby pure water or a chemical solution is supplied selectively. The processing liquid (pure water or the chemical solution) is supplied at the processing liquid nozzle 5, whereby a space SP between the front surface Wf of the substrate and the opposed surface 3*a* of the blocking plate 3 is filled up with the processing liquid in liquid-tight state. In this embodiment, the processing liquid nozzle 5 thus functions as the "processing liquid supplier" of the invention.

A side wall (side wall surface 3*b*) of the blocking plate 3 serves as a surface of incidence for the ultrasonic propagation liquid which is injected at the ultrasonic nozzle 7 which will be described later, and rises perpendicular to the opposed surface 3*a* of the blocking plate 3. The height of the side wall surface 3*b* (the thickness of the blocking plate 3) is properly large enough to prevent the ultrasonic propagation liquid injected at the ultrasonic nozzle 7 from reaching the top surface and the bottom surface (the opposed surface 3*a*) of the blocking plate 3. As the ultrasonic propagation liquid hits the side wall surface 3*b* of the blocking plate 3, ultrasonic vibration propagates to the blocking plate 3 and the entire blocking plate 3 vibrates. The ultrasonic vibration which has propagated to the blocking plate 3 propagates and spreads inside the blocking plate 3. Some of the vibrational waves reach the processing liquid attaining the liquid-tight state from the blocking plate 3 and vibrates the processing liquid.

Fine quartz is used as the material of the blocking plate 3, noting that (1) the material must attain easy propagation of ultrasonic waves, (2) the material must be clean, (3) the material must be resistant against chemical solutions and (4) the material must be easily processed. As for other material than quartz which permits propagation of ultrasonic waves, as long as the other material is free of problems such as elution to the processing liquid (which is not limited to pure water) or to the extent that elution or other problem is tolerated, sapphire, ceramics, SiC or the like may be used.

Disposed as the "ultrasonic wave applying element" of the invention on the side of the blocking plate 3 is the ultrasonic nozzle 7 which injects toward the side wall surface 3*b* of the blocking plate 3 the liquid (pure water) to which ultrasonic vibration has propagated. To be more specific, the ultrasonic nozzle 7 is disposed such that the liquid injected out at the ultrasonic nozzle 7 hit the side wall surface 3*b* of the blocking plate 3 approximately perpendicularly in the event that the blocking plate 3 has moved down to the processing position which is in the proximity of and opposed against the substrate W. In short, the outlet of the ultrasonic nozzle 7 is open toward the side wall surface 3*b* of the blocking plate 3, and the injection direction P in which the ultrasonic propagation liquid is injected is approximately parallel to the front surface Wf of the substrate.

Figure 2:
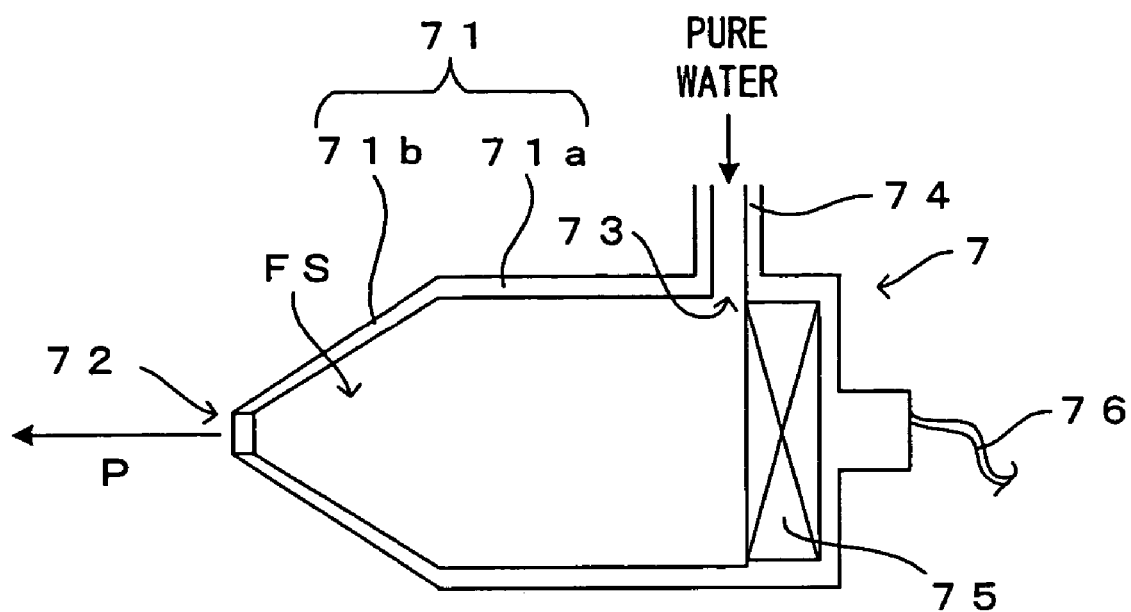
FIG. 2 is a drawing of the structure of an ultrasonic nozzle.

The structure of the ultrasonic nozzle 7 will now be described in detail with reference to FIG. 2. The ultrasonic nozzle 7 is a nozzle of the so-called horn type, and a nozzle main body 71 comprises a lidded trunk section 71*a* which is shaped like a cylinder and a nozzle end section 71*b* which is combined with the trunk section 71*a* and whose cross section is shaped approximately like the letter V. A filling space FS is defined inside the nozzle main body 71 which can be filled up with the liquid (pure water). The nozzle end section 71*b* has an outlet 72 at which the liquid supplied into the filling space FS is injected to outside. The area size of the opening of the outlet 72 is smaller than the area size of the vertical cross section (namely, the cross sectional surface which is approximately orthogonal to the injection direction P of the liquid) of the trunk section 71*a*. In other words, the vertical cross section of the nozzle end section 71*b* is increasingly smaller from the joint with the trunk section 71*a* (the right-hand side in FIG. 2) to the opening (the left-hand side in FIG. 2). The side surface of the trunk section 71*a* comprises a supply port 73 through which pure water is supplied into the filling space FS and which links to the pure water supply unit 21 via a pipe 74. Hence, as pure water is supplied into the filling space FS through the pipe 74, the pure water is injected at the outlet 72 from the filling space FS along the injection direction P.

Inside the nozzle main body 71, there is an ultrasonic transducer 75 which is fixed to the top wall surface of the trunk section 71*a* such that the ultrasonic transducer 75 is opposed against the outlet 72. A thin plate of quartz or fine SiC (silicon carbide) is pasted on a surface of the ultrasonic transducer 75. The ultrasonic transducer 75 is electrically connected with a cable 76 and the cable 76 is electrically connected with an ultrasonic generator (not shown). The ultrasonic transducer 75 is capable of emitting ultrasonic waves toward pure water which is contained inside the filling space FS and accordingly applying ultrasonic waves upon pure water which is injected out at the outlet 72.

Figure 3:
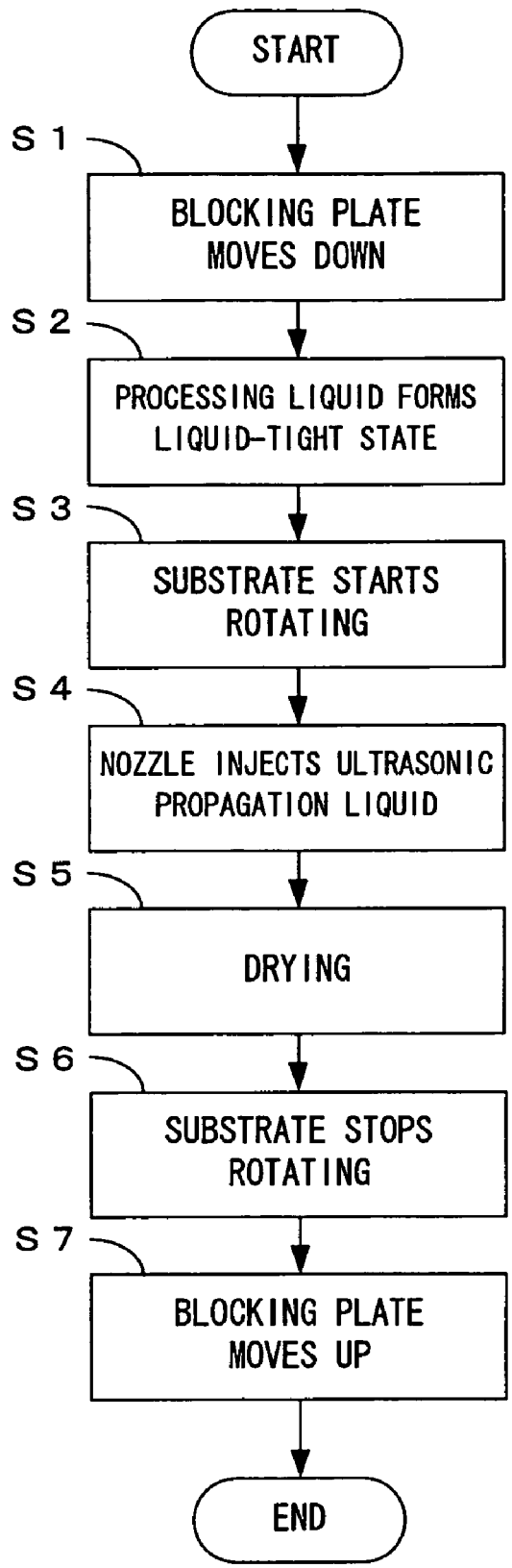
FIG. 3 is a flow chart which shows operations which the substrate processing apparatus of FIG. 1 performs.

Operations of the substrate processing apparatus having the structure above will now be described. FIG. 3 is a flow chart which shows operations which the substrate processing apparatus of FIG. 1 performs. FIG. 4 is a schematic drawing which shows the operations which the substrate processing apparatus of FIG. 1 performs. In this apparatus, as the substrate W whose front surface Wf seats device patterns is loaded and placed on the spin base 15 in a condition that the pattern seating surface is directed toward above, the control unit 4 makes the plural chuck pins 17 switch to the pressing state from the release state and the substrate W is held at its rim portion. As a result, the substrate W is held approximately horizontally. For transportation of the substrate W, the blocking plate 3 is located at the retract position which is above the spin chuck 1, thereby preventing interference with the substrate W.

As the substrate W is held at the chuck pins 17, the control unit 4 moves down the blocking plate 3 to the processing position and the blocking plate 3 is positioned close to and opposed against the substrate W (Step S1; vibration member positioning step). The front surface Wf of the substrate is consequently covered with the opposed surface 3*a* of the blocking plate 3 and blocked from the external atmosphere around the substrate W. As shown in FIG. 4A, the processing liquid is supplied toward a central section of the front surface Wf of the substrate from the processing liquid nozzle 5 and the space SP between the front surface Wf of the substrate and the opposed surface 3*a* of the blocking plate 3 becomes sealed up liquid-tight, whereby a puddle of the processing liquid is formed inside the space SP (Step S2; liquid-tight state forming step). Since the plan size of the blocking plate 3 is equal to or larger than the plan size D of the substrate W, the processing liquid forms the liquid-tight state all over the front surface Wf of the substrate (i.e., a liquid column whose cross section is approximately the same as the front surface Wf of the substrate is formed).

Next, the control unit 4 controls the chuck rotary drive mechanism 13 and accordingly rotates the spin base 15, thereby rotating the substrate W while the processing liquid maintains the liquid-tight state between the substrate W and the blocking plate 3 (Step S3). It is ideal at this stage to control the blocking plate rotary drive mechanism 33 while the substrate rotates so that the blocking plate 3 rotates in the same rotation direction and at approximately the same rotation speed as the spin base 15. This attains effective dispersion of the ultrasonic vibration applied upon the blocking plate 3 inside the blocking plate 3.

In this condition, the ultrasonic propagation liquid (pure water) is injected out at the ultrasonic nozzle 7 which is located on the side to the blocking plate 3 as shown in FIG. 4B and the ultrasonic propagation liquid hits the opposed surface 3a of the blocking plate 3 approximately perpendicularly (Step S4; ultrasonic wave applying step). The ultrasonic waves move passed the interface between the liquid (ultrasonic propagation liquid) and the solid (blocking plate 3), propagate inside the blocking plate 3 and vibrate the blocking plate 3. The ultrasonic vibration thus entering the blocking plate 3 spreads inside the blocking plate 3 while getting dispersed along the horizontal direction. The vibrational waves partially (those components which are downward and perpendicular to the direction in which the ultrasonic waves are incident upon the blocking plate 3) are uniformly and widely transmitted from the entire opposed surface 3a of the blocking plate 3 to the processing liquid attaining the liquid-tight state and vibrate the processing liquid. Since the blocking plate 3 as a whole vibrates via the liquid (ultrasonic propagation liquid), it is possible to effectively disperse the vibrational energy inside the blocking plate 3.

It is therefore possible to equally attenuate the energy density of the ultrasonic vibration which propagates to the front surface Wf of the substrate. To be more specific, the vibrational energy controlled to a threshold value to the extent not damaging the patterns can propagate all over the front surface Wf of the substrate. In consequence, contaminants such as particles are removed without damaging the patterns formed on the front surface Wf of the substrate. The centrifugal force acting upon the processing liquid speedily discharges thus removed contaminants to outside the substrate.

As cleaning of the substrate W ends in this manner, as shown in FIG. 4C, the control unit 4 enhances the rotation speeds of the motors for the chuck rotary drive mechanism 13 and the blocking plate rotary drive mechanism 33, whereby the substrate W and the blocking plate 3 rotate at high speeds. This spins off and dries the processing liquid adhering to the substrate W and the blocking plate 3 as they are after cleaned (Step S5).

As drying ends, the control unit 4 controls the blocking plate rotary drive mechanism 33, thereby stopping the blocking plate 3 from rotating, and controls the chuck rotary drive mechanism 13, thereby stopping the substrate W from rotating (Step S6). The blocking plate 3 then moves up, the plural chuck pins 17 holding the substrate W at the rim portion of the substrate W switch from the pressing state to the release state, and the processed substrate W is unloaded from the apparatus (Step S7).

As described above, in this embodiment, the processing liquid forms the liquid-tight state inside the space SP between the front surface Wf of the substrate and the opposed surface 3a of the blocking plate 3 and the liquid to which the ultrasonic vibration has propagated is applied to the side wall surface 3b of the blocking plate 3. The ultrasonic vibration therefore propagates inside the blocking plate 3 while getting widely dispersed and reaches the front surface Wf of the substrate through the processing liquid attaining the liquid-tight state from the entire opposed surface 3a of the blocking plate 3. Hence, it is possible to equally attenuate the density of the energy which propagates to the front surface Wf of the substrate without concentration of the vibrational energy at the front surface Wf of the substrate. As a result, it is possible to uniformly process the substrate W while suppressing damage to the substrate W.

Further, in this embodiment, since the plan size of the blocking plate 3 is equal to or larger than the plan size D of the substrate W, the following effects are attained. That is, the effective area size in which the vibrational energy of the ultrasonic waves is dispersed expands to the plan size D of the substrate W (front surface Wf), thereby effectively achieving uniform dispersion of the density of the energy which propagates to the front surface Wf of the substrate. In addition, since the cross sectional size of the processing liquid attaining the liquid-tight state (liquid column) is smaller than the plan size of the blocking plate 3, it is possible to avoid an influence exerted by reflection of the ultrasonic waves at the side wall surface 3b of the blocking plate 3. That is, the boundary between the processing liquid and the surrounding atmosphere (the side surface of the liquid column) retracts toward the inner side along the diameter direction than the side wall surface 3b of the blocking plate 3, thereby reducing an influence exerted by reflected waves which are inside the blocking plate 3 and near the side wall surface 3b and preventing damage to the patterns.

In light of above, it is desirable that the plan size of the blocking plate 3 is sufficiently larger than the plan size D of the substrate W as shown in FIG. 5. This eliminates an influence exerted by reflection of ultrasonic waves at the side wall surface 3b of the blocking plate 3 without fail.

Further, in this embodiment, since the ultrasonic propagation liquid hits the blocking plate 3 approximately horizontally, the ultrasonic vibration propagating inside the blocking plate 3 gets dispersed along the horizontal direction, which prevents concentration of the vibrational energy. In short, when the ultrasonic propagation liquid is allowed to the blocking plate 3 at a predetermined angle with respect to the top or the bottom surface (opposed surface 3a) of the blocking plate 3, it is not possible to sufficiently disperse the vibrational energy along the horizontal direction and the substrate W is therefore exposed to and damaged by the ultrasonic waves which are concentrated in a narrow area, whereas this embodiment prevents concentration of the vibrational energy and avoid damage to the substrate W. Still further, since the direction of entry of the ultrasonic propagation liquid is approximately parallel to the front surface Wf of the substrate, it is possible to prevent the ultrasonic waves from directly reaching the front surface Wf of the substrate and damaging the substrate W. Moreover, since the ultrasonic propagation liquid hits the side wall surface 3b of the blocking plate 3 approximately perpendicularly, it is possible to prevent concentration of the vibrational energy in the vicinity of the interface between the liquid (ultrasonic propagation liquid) and the solid (blocking plate 3) without blocking transmission of the ultrasonic waves at the interface.

Further, in this embodiment, since the ultrasonic propagation liquid hits the blocking plate 3 while the blocking plate 3 rotates, it is possible to effectively disperse the ultrasonic vibration which propagates inside the blocking plate 3. In addition, since the blocking plate 3 is capable of rotating, the blocking plate 3 when rotating spins off and expels the processing liquid adhering to the same, and the blocking plate 3 can be cleaned regularly.

The invention, requiring that the blocking plate 3 vibrates via the ultrasonic propagation liquid, solves the following problem which arises when the ultrasonic transducer is attached directly to the opposed member such as the blocking plate which is disposed in the proximity of the substrate W. That is, installing wires or the like for attaching and driving the ultrasonic transducer to the opposed member which is disposed close to the substrate W works to extreme disadvantage for a cleaning apparatus which must avoid accumulation of contaminants at any cost and further could offset the cleaning effect. It is therefore particular necessary to dispose the opposed member above so that drops adhering to the opposed member will not remain and it is necessary to rotate the opposed member for cleaning of the opposed member. At the stage of practicing this, plural wires disposed to the rotation shaft and supply of the processing liquid and if necessary gas (such as nitrogen) will easily lead to accumulation of contaminants which will not be cleaned up even by self-cleaning.

On the contrary, the method according to the invention which vibrates the opposed member, which is disposed close to the substrate W, via the ultrasonic propagation liquid, not requiring to attach the ultrasonic transducer and wires or the like to the opposed member itself, is not likely to cause accumulation of contaminants described above and makes it easy to maintain the cleanliness by means of self-cleaning.

The invention is not limited to the embodiment described above but may be modified in various manners in addition to the embodiment above, to the extent not deviating from the object of the invention. For instance, although the embodiment described above requires that the plan size of the blocking plate 3 is equal to or larger than the plan size D of the substrate W, this is not limiting. The plan size of the blocking plate 3 may be any desired size to the extent it is possible to achieve the liquid-tight state of the processing liquid between the front surface Wf of the substrate and the blocking plate. Even when the plan size of the blocking plate is half the plan size D of the substrate W for example, it is possible to clean the entire front surface Wf of the substrate as long as the substrate W (or the blocking plate) can rotate while maintaining the liquid-tight state of the processing liquid between the front surface Wf of the substrate and the blocking plate.

Further, although the blocking plate 3 is a plate-like member which is shaped like a disk in the embodiment above, the shape of the blocking plate 3 is not limited to this. The shape may be any desired shape to the extent that it has the opposed surface facing the substrate and to the extent it is possible to achieve the liquid-tight state of the processing liquid between the front surface Wf of the substrate and the blocking plate and apply the ultrasonic propagation liquid to the non-opposed surface except the opposed surface. For instance, the shape may be rectangular parallelepiped, conical or dome-like.

Further, as for the processing liquid for use in this substrate processing apparatus, while use of pure water attains the cleaning effect, for efficient development of cavitations in the processing liquid due to ultrasonic vibration, a nitrogen dissolved water, a chemical solution which provides etching such as SC1 (mixture of ammonia and hydrogen peroxide solution), or the like may be used instead of pure water. Further, a surface active agent may be added to the processing liquid for improvement of wettability to the front surface Wf of the substrate. Further, the liquid discharged at the ultrasonic nozzle 7 is not limited to pure water but may be any liquid which does not adversely influence the liquid-tight state of the processing liquid.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
   a substrate holder which holds a substrate approximately horizontally;
   a blocking member made of a material which permits propagation of ultrasonic vibration, said blocking member comprising an opposed surface which can become opposed against a surface-to-be-processed of said substrate which is held by said substrate holder, said opposed surface being spaced apart from but opposed against said surface-to-be-processed;
   a processing liquid supplier which supplies a processing liquid to a space which is formed between said surface-to-be-processed of said substrate and said opposed surface of said blocking member, thereby filling said space up with said processing liquid in liquid-tight state; and
   an ultrasonic wave applying element which applies a liquid to which ultrasonic vibration has propagated to a non-opposed surface of said blocking member except said opposed surface to generate an ultrasonic vibration in said blocking member, said ultrasonic vibration being partially transmitted from said entire opposed surface to said surface-to-be-processed through said processing liquid.

2. The substrate processing apparatus of claim 1, further comprising a substrate rotator which rotates said substrate holder and accordingly rotates said substrate.

3. The substrate processing apparatus of claim 1, wherein an incidence direction in which said liquid to which ultrasonic vibration has propagated reaches said non-opposed surface of said blocking member is approximately horizontal.

4. The substrate processing apparatus of claim 1, wherein said non-opposed surface is a side wall surface which rises approximately perpendicular to said opposed surface and said liquid to which ultrasonic vibration has propagated hits said side wall surface approximately perpendicularly.

5. The substrate processing apparatus of claim 1, wherein said opposed surface of said blocking member has a plan size which is equal to or larger than the plan size of said surface-to-be-processed of said substrate.

6. The substrate processing apparatus of claim 1, further comprising a blocking member rotator which rotates said blocking member.

7. The substrate processing apparatus of claim 1, wherein said blocking member is made of quartz.

\* \* \* \* \*

UNITED STATES PATENT AND TRADEMARK OFFICE
CERTIFICATE OF CORRECTION

PATENT NO. : 7,617,833 B2
APPLICATION NO. : 11/296808
DATED : November 17, 2009
INVENTOR(S) : Izumi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Nineteenth Day of October, 2010

David J. Kappos
*Director of the United States Patent and Trademark Office*